United States Patent [19]

Hagenlocher et al.

[11] Patent Number: 4,540,907
[45] Date of Patent: Sep. 10, 1985

[54] ALTERNATOR-RECTIFIER UNIT WITH ECONOMICAL CONNECTIONS TO WIRES EMBEDDED IN A CIRCUIT BOARD

[75] Inventors: Walter Hagenlocher; Lutz Rapp, both of Stuttgart; Werner Eschen, Köngen; Istvan Ragaly, Schwieberdingen; Heinz Scharpf, Remshalden; Jörg Streller, Affalterbach; Johann Weigand, Güglingen; Klaus Winkler, Freiberg, all of Fed. Rep. of Germany

[73] Assignee: Robert Bosch GmbH, Stuttgart, Fed. Rep. of Germany

[21] Appl. No.: 470,266

[22] Filed: Feb. 28, 1983

[30] Foreign Application Priority Data

Mar. 12, 1982 [DE] Fed. Rep. of Germany ....... 3208893

[51] Int. Cl.³ ............................................. H02K 11/00
[52] U.S. Cl. ..................................... 310/68 D; 310/71
[58] Field of Search ..................... 310/68 R, 68 D, 71

[56] References Cited

U.S. PATENT DOCUMENTS

| 3,641,374 | 2/1972 | Sato | 310/68 D |
| 3,866,072 | 2/1975 | Nagai | 310/68 D |
| 3,895,247 | 7/1975 | Iwata et al. | 310/68 D |
| 3,970,881 | 7/1976 | Sato | 310/68 D |
| 4,103,193 | 7/1978 | Ito | 310/68 D |

*Primary Examiner*—Donovan F. Duggan
*Attorney, Agent, or Firm*—Frishauf, Holtz, Goodman & Woodward

[57] ABSTRACT

A wire conductor embedded in a circuit board for interconnecting rectifier diodes passes through a cut-out of the circuit board and is bent out of the cut-out beyond the surface of the circuit board so as to provide a U-shaped connection piece in which the end of a generator winding wire can be laid and clamped until it is soldered. The U-shaped connection piece can also be provided by a clip affixed to the embedded wire where it is accessible in a cut-out of the circuit board.

9 Claims, 11 Drawing Figures

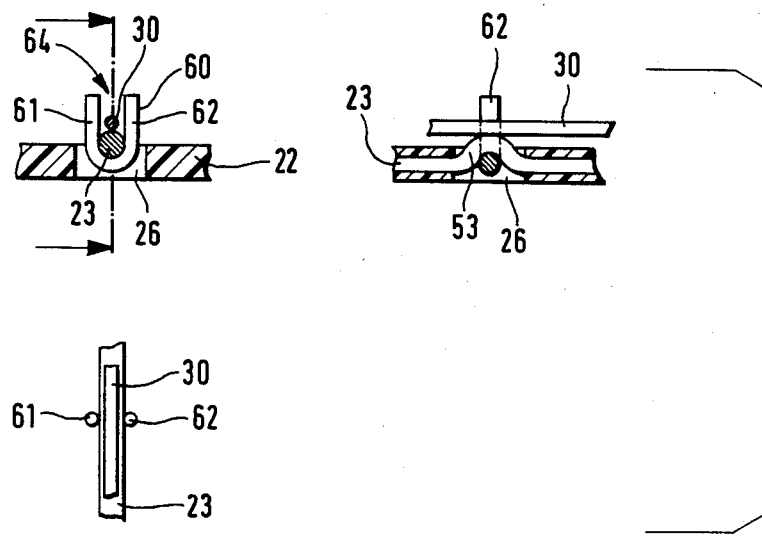
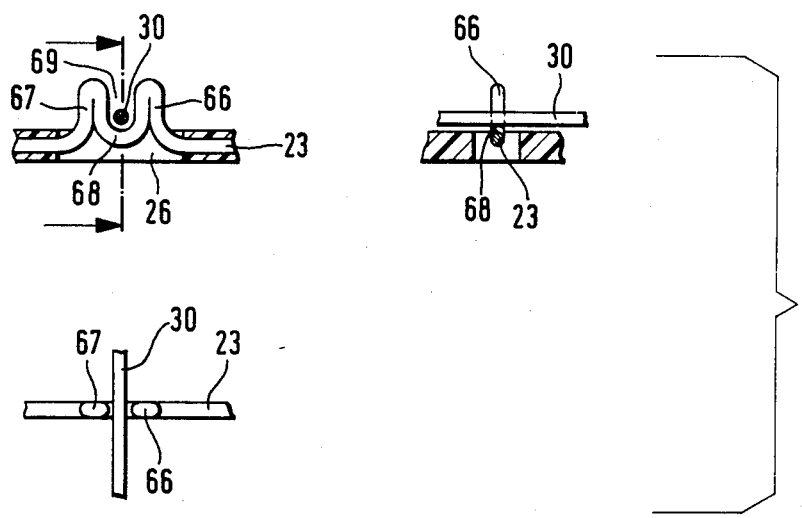

1

ALTERNATOR-RECTIFIER UNIT WITH ECONOMICAL CONNECTIONS TO WIRES EMBEDDED IN A CIRCUIT BOARD

This invention concerns an alternator-rectifier unit suitable for vehicular service of the kind having a shaft-mounted rotor carrying an excitation winding, a stator equipped with windings for producing 3-phase a.c., a 3-phase full wave rectifier having at least three positive-pole diodes and three negative-pole diodes for rectifying the 3-phase a.c., a circuit board of insulating material oriented perpendicular to and extending at least partly around the axis of the shaft on which the rotor is mounted, and circuit conductors embedded in the circuit board for contributing to the interconnection of the diodes and windings.

In such alternator-rectifier units, it is common to provide cut-out portions in the circuit board through at least some of which each of the embedded wires runs. Published German patent application (OS) No. 3001522 shows such a unit in which these cut-out portions of a circuit board, which constitute places for connections to the embedded wire, narrow-necked loops bent out from the portion of the embedded wire passing through the cut-outs are formed. The circuit board, of course, is of insulating material and the wire loops brought out from the cut-out portions extend above the surface of the circuit board. These loops provide difficulty, however, for mass-production because they constitute in effect closed eyes into which the ends of the winding wires must be threaded, making it necessary to hold the winding wire ends in these eyes until subsequent soldering steps can be performed on the various eyes of the circuit board.

THE INVENTION

It is an object of the invention to provide the connections at the cut-out portions of the circuit board in such a way that the prepared ends of the insulated winding wires can be clamped and thereafter soldered.

Briefly, instead of eye-like loops, U-shaped connection pieces are provided, which have the legs forming the U extending from the cut-out portions of the circuit board beyond one of the surfaces of the circuit board, the legs being sufficiently spaced from each other for clamping the end of a winding wire between them.

Various ways of providing an open U of conductor material, either out of a portion of the embedded wire or by means of an added part, for clamping the end of a winding wire are described in the detailed description of the invention that follows below.

THE DRAWINGS

The aforesaid detailed description, provided by the way of illustrated example, refers to the annexed drawings, in which.

FIGS. 4 to 11 respectively show different forms of connections for clamping the ends of winding wires to make an electrical connection to an embedded wire of a circuit board, each of these figures presenting interrelated views in three different planes, namely at the upper left by a section in a plane perpendicular to the circuit board, to the right of it a section at 90° to the one just mentioned and likewise perpendicular to the circuit and, below the lefthand representation, a plan view down onto the circuit board.

DESCRIPTION OF THE ILLUSTRATED EMBODIMENTS

Figure 1:
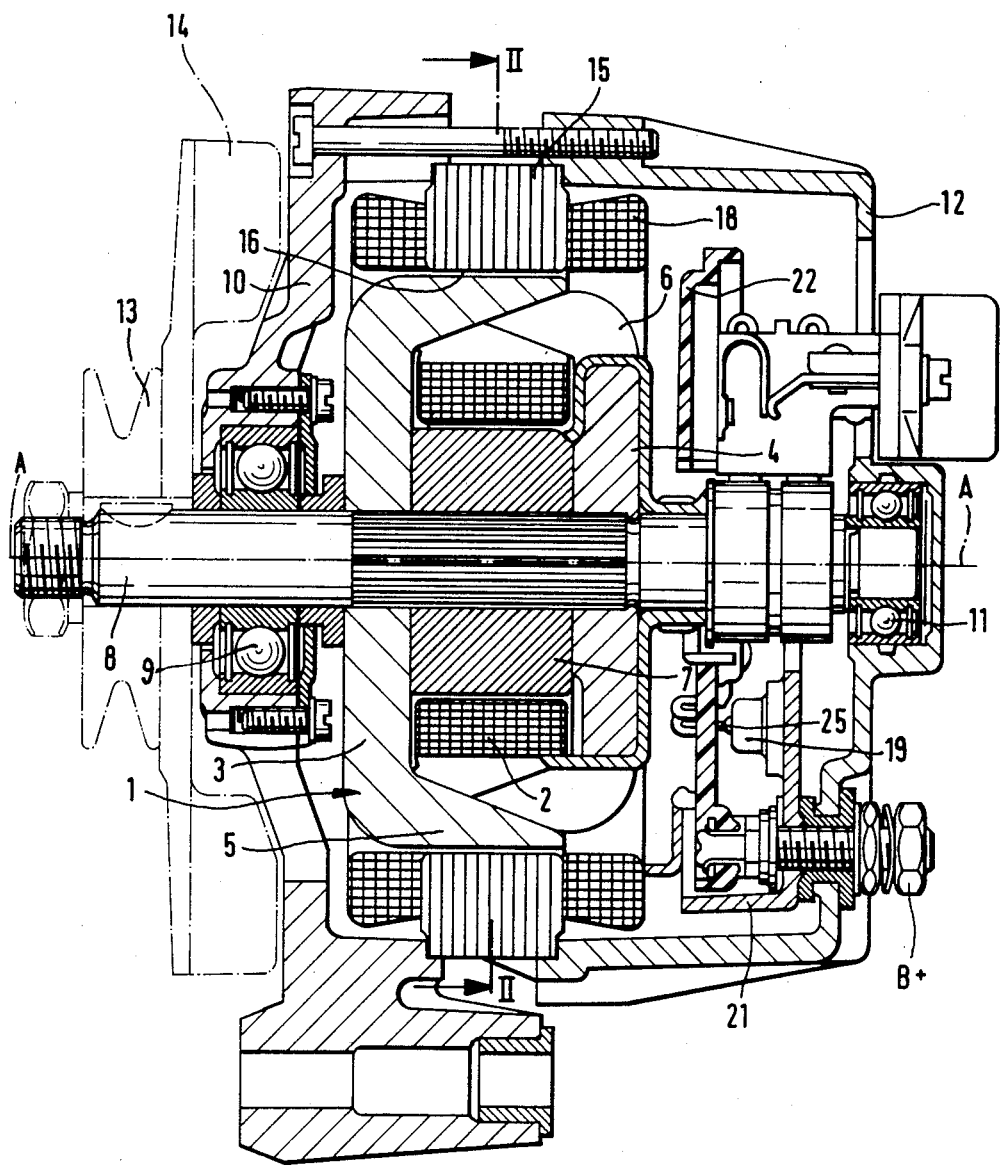
FIG. 1 is a cross-section, along its axis, of an alternator-rectifier unit having a circuit board with embedded wires brought out for connections.
Figure 2:
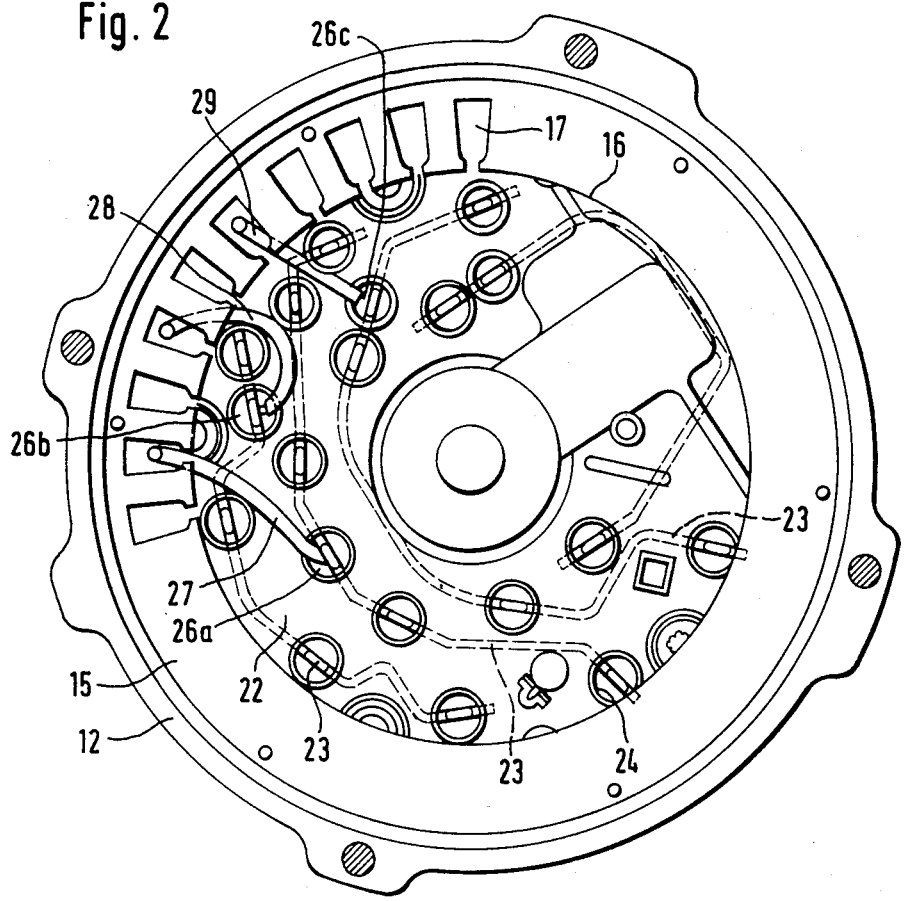
FIG. 2 is a cross-section along the line II—II of FIG. 1 providing a view of the circuit board, its cut-out portions and embedded wires.

The alternator-rectifier unit shown in FIGS. 1 and 2 is designed for operation in a motor vehicle and contains a claw-pole rotor 1 provided with an exciter winding 2 and two pole wheels 3 and 4 that interfit with respective claw-poles 5 and 6, which are affixed to the rotor shaft 8, along with a cylindrical core 7. The rotor shaft 8 is provided with a ball bearing 9 in a front end bell 10 and with a second ball bearing shown at 11 in a rear end bell 12, for rotation of the rotor. In dot-dash lines, there are shown a splined pulley 13, for belt drive from the vehicle engine, mounted on the shaft 8 together with the fan wheel 14 that ventilates the unit.

Disposed transversely with respect to the axis of rotation A-A of the claw-pole rotor 1 and its rotor shaft 8, there is clamped, between the two end bells 10 and 12, a stator lamination stack 15 that is reproduced in section in FIG. 2 and carries the 3-phase a.c. winding 18 consisting of three phase windings U, V and W in its channel grooves 17 that are evenly distributed around the circumference of its stator bore 60. The winding 18 is not shown in FIG. 2, in order to allow the representation of the remaining structure to be clearer. In the course of one revolution of the claw-pole rotor 1, there are induced, in the phase windings three alternating voltages successively offset from each other in phase by 120°. These phase voltages are rectified in the circuit shown in FIG. 3 by a rectifier comprising six positive-pole diodes 19 and six negative-pole diodes 20, with the output then being made available between the insulated positive pole B+ and the vehicle-grounded frame of the alternator, for supplying power to a d.c. electrical system for the vehicle.

Figure 3:
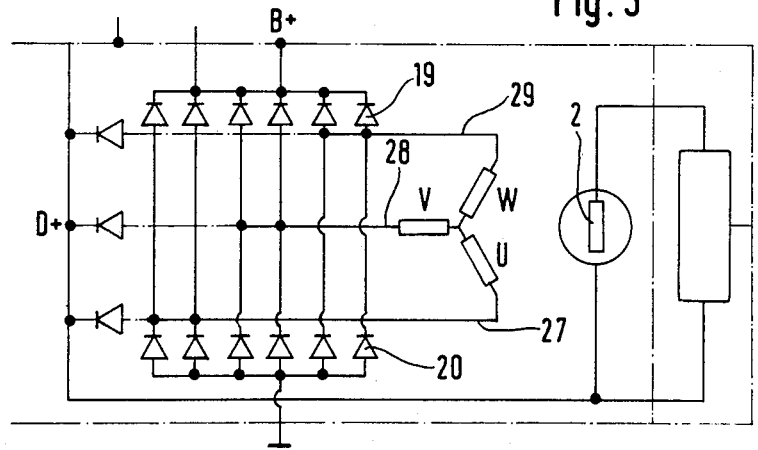
FIG. 3 is a diagram of the electrical circuit of the alternator-rectifier unit of FIGS. 1 and 2.

The positive-pole diodes 19, as shown in FIG. 3, are mounted on a common kidney-shaped cooling plate of metal designated 21 in FIG. 1, which is insulatedly mounted on the end bell 12 in the manner shown, while the negative-pole diodes are disposed on a second cooling plate, not shown in the drawing, that is connected in an electrically conductive fashion to the end bell 12. A plastic injection-molded circuit board 22 is interposed between the cooling plates carrying the diodes to one side of the circuit board and the pole wheel 4 on the other side. The circuit board 22 has embedded therein conductors 23 of copper wire shown in the drawing in part with broken lines, these conductors being accessible at different cut-outs 24 for connecting the diode connection wires 25 running axially and parallel to the rotor axis. The three cut-outs designated 26a, 26b and 26c have connection pieces for connection of the three wire ends 27, 28 and 29, respectively belonging to the phase windings U, V and W.

Various embodiments of the connection pieces provided in accordance with the invention are shown in FIGS. 4 to 11. These connection pieces all have a U-shaped configuration for receiving a wire end to be connected. The legs of the U of the connection pieces extend out from the side of the circuit board facing the claw-pole rotor and there have a small mutual spacing that is just sufficient for clamping one of the wire ends 27, 28 and 29, and holding them in position until a subsequent soldering step is performed.

In FIGS. 4 to 11, the cut-outs 26a, 26b and 26c are represented as indicated with the reference numeral 26, independently of their particular position, since that is determined simply by the nearness of the winding ends 27, 28 and 29 respectively.

Figure 4:
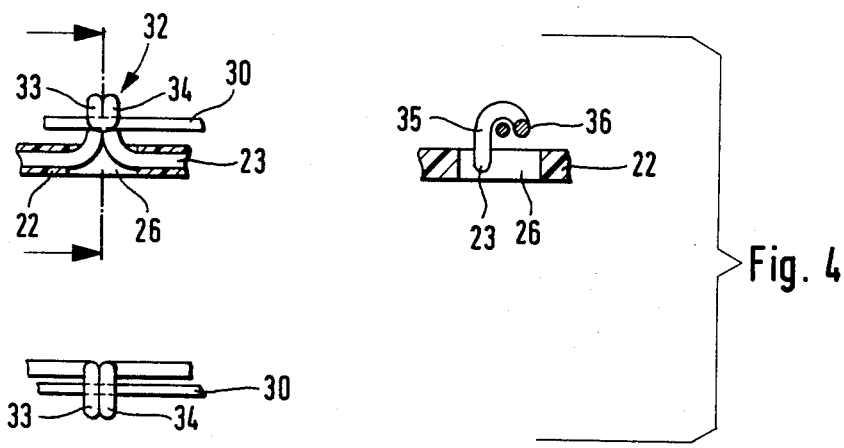

In the embodiment shown in FIG. 4, the illustrated connection piece 32 is bent into a hook out of a section of the conductor wire 23 passing through the cut-out portion of the circuit board. This is done in such a way that two parallel and closely adjacently-lying wire sections 33 and 34 are produced, which are then bent into a U profile, such that the two legs 35 and 36 of the U have a small spacing from each other so that a winding connection wire can be slipped in the from below and mechanically clamped in place, the winding end being given the general designation 30 instead of one of the specific winding end designations 27, 28 and 29. Once the winding end is clamped, it can be held fast at least until a subsequent soldering step finally completes the connection.

Figure 5:
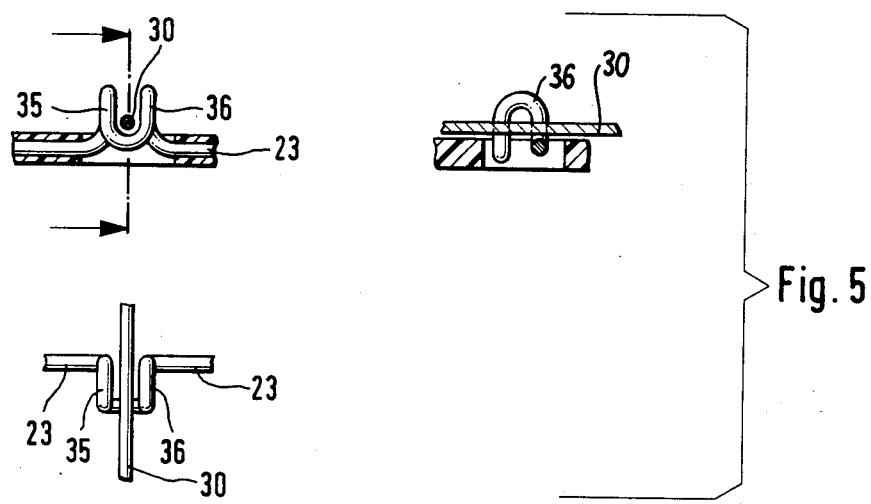

In the embodiment shown in FIG. 5, the two legs of the U 35 and 36 and the winding wire end 30 are again shown. In this case, the latter can run transverse to the longitudinal direction of the unbent and approximately rectilinearly running portions of the embedded conductor 23 in the circuit board 22.

Figure 6:
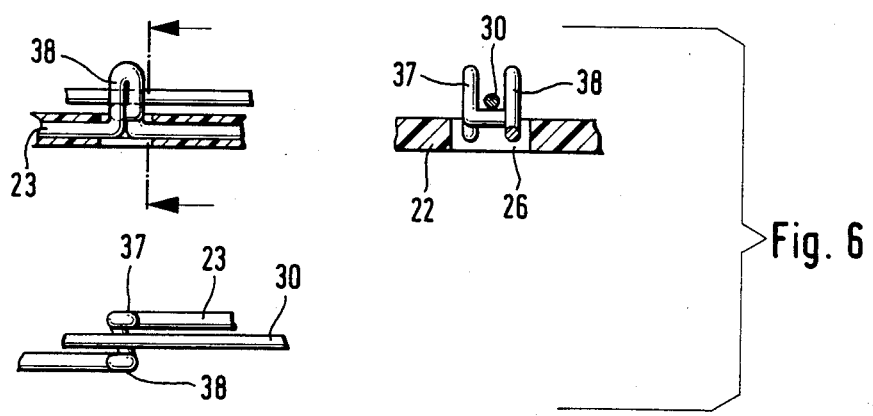

In FIG. 6, an embodiment is shown in which doubled over wire stubs 27 and 38, connected to provide the U profile, extend beyond the surface of the circuit board 22 and again are made from the conductor wire 23 passing through the cut-out portion of the circuit board where the connection is to be made. Each of the doubled stubs 37 and 38 forms one of two legs of the U, between which the winding connection wire 30 can be laid and clamped.

Figure 7:
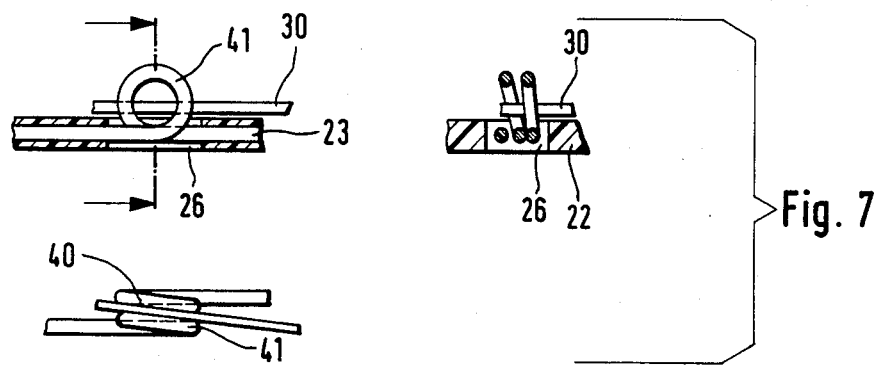
Figure 8:
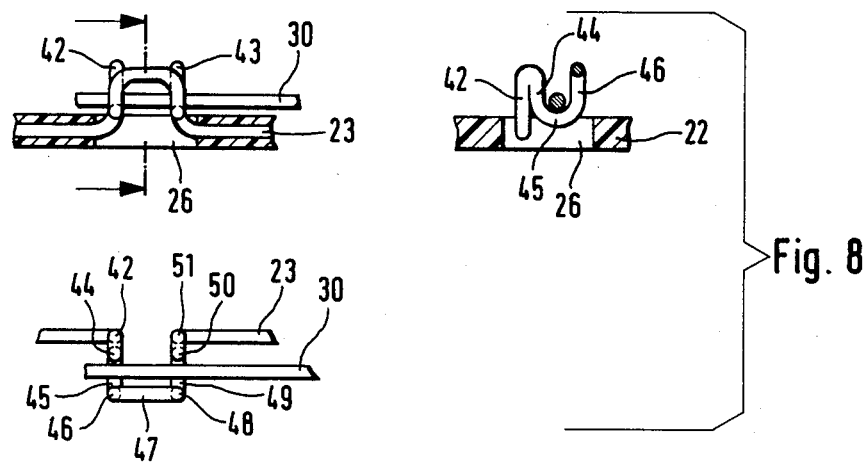

In the embodiment of FIG. 7, the wire 23 passing through the cut-out portion of the circuit board is wound into two circular turns 41 which are coaxial and of the same size and have a slight resilient compression bias against each other, and are accordingly particularly suitable for clamping the winding end 30 between them. Looking between the turns a U profile appears. In the emodiment of FIG. 8, the conductor 23 of the circuit board 22 is brought out above the upperside plane of the circuit board in two stubs 42 and 43 bent up at a considerable spacing from each other and connected to sections of wire 44,50 which dip down in U-shape into the cut-out 26 of the circuit with continuing portions 45, 49, these respective U-shape portions being connected by a bridge portion 47, the respective portins 44,45,46 and 48,49,50 having mirror symmetry with respect to the bridge portion 47 between them, which is perpendicular to the U profiles of those respective portions just mentioned. The wire portions 42 and 44 are closely adjacent, as are also the corresponding wire portions 43 and 50, the wire 23 in each case being bent over tightly to provide that configuration.

Figure 9:
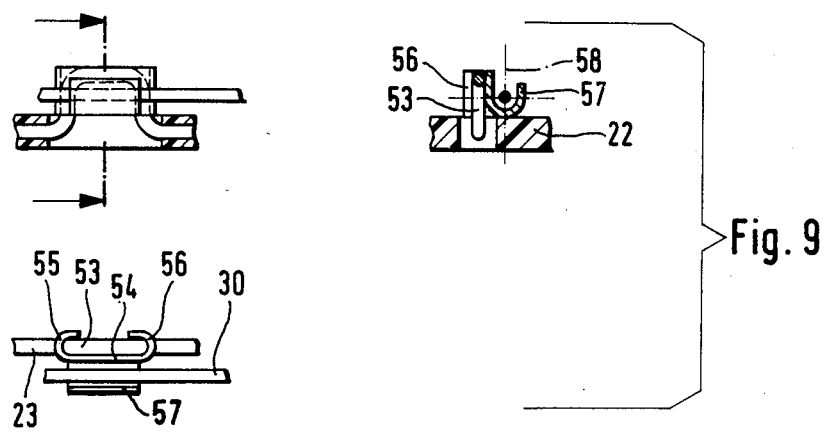

In contrast to the above-described embodiments of the U-shaped connection pieces in which in each case a deformed section of the conductor wire 23 provides the connection piece, there are shown in FIGS. 9 to 11 embodiments in which a separately made connection piece is provided which is affixed on a bent-out portion 53 of the conductor 23 in the region of the cut-out 26 of the circuit board.

In the embodiment of FIG. 9, a bracket-shaped sheet metal strip 54 is crimped at both of its ends around the bent-out portion 53 of the wire 23 by means of two semicircular bends 55 and 56 in such a way that the connection piece can be pushed onto the wire portion 53, even after the circuit board 22 is press-molded and hard. It can then be clamped hard on the wire portion 53 and then electrically connected with the wire by soldering welding. In the midportion of the sheet metal strip 54, a tab 57 is provided which is bent in U-shape about the axis 58 that runs parallel to the wire 23 and its raised portion 53, in such a manner that between the strip 54 and the opposed end of the tab 57 operating as the other leg of the U, a wire end 30 can be inserted and clamped.

In the embodiment of FIG. 10, in the completed condition of the circuit board 22, the bent-out portion 53 of the embedded conductor 23 extends slightly above the surface of the circuit board. A clip 60 previously bent into U-shape out of copper or brass wire of round cross-section goes around the conductor 23 and its legs 61 and 62 extend away from it to provide a narrow space 64 for accepting the winding connection wire 30. In this embodiment it is possible without difficulty to weld the clip 60 at the location of the particular bent-out portion 53 to the conductor 23 or otherwise provide an electrically conducting connection to the wire 23 before the wire 23 is laid into the mold for the circuit board 22. On the other hand, there is still the possibility to produce the circuit board without first furnishing the connection pieces, and only thereafter to insert the clips 60 from below through the cut-out 26 over the conductor 23 and to push the exposed portion of the latter upwards so as to deform it in order to provide the desired disposition of the connection piece for attachment of the winding connection wire 30.

In the embodiment shown in FIG. 11, a very simply constituted bending scheme is provided that is useful for the conductor 23 in a continuous process. Here, the conductor 23 which is continuous from one side to the other of the cut-out 26, is folded back on itself sharply in twin stubs 66 and 67 lying at a close spacing one behind the other, connected by a semicircular piece 68 and forming a U profile with the latter, of which the legs 66 and 67 bound the space 69 for accepting the winding connection wire 30.

In FIGS. 4, 5, 6, 7, 8 and 9, a substantially increased soldering surface can be obtained by multiple (folded) insertion of the connecting wire. In all embodiments, the mechanical clamping action provides supplementary security for the soldered connection.

The embodiment of FIG. 5 is particularly suited for automation procedure of laying in place the connection wire 30, which is to say of the several winding ends 27,28 and 29, and likewise for the manufacture of the connection pieces.

Although the invention has been described with respect to particular illustrative embodiments, it will be seen that further modifications and variation are possible within the inventive concept.

We claim:

1. An engine-driven alternator-rectifier unit, suitable for vehicular service, having a shaft-mounted rotor carrying an excitation winding, a stator equipped with windings for producing 3-phase a.c., a 3-phase full wave rectifier having at least three positive-pole diodes and three negative-pole diodes for rectifying said 3-phase a.c. and further comprising:

a flat circuit board of insulating material having parallel surface planes and oriented perpendicular to and extending at least partially around the axis of the shaft on which said rotor is mounted, and circuit conductor wires embedded in said circuit board for contributing to the interconnection of said diodes and said windings, said circuit board having cut-out portions which are substantially vacant except for portions of said embedded wires extending out of said circuit board and passing through said cutout portions, and which cut-out portions are located at places selected for connecting external conductors, including lead wires of said windings, respectively, to said embedded wires, said portions of said embedded wires at said selected places passing through said cut-out portion of said circuit board, being substantially longer than required for crossing said cut-out portions, and each having an intermediate length of wire bent at both ends in first planes of bending which are substantially parallel or identical so as to bring a major part of said intermediate wire length outward beyond one of the surface planes of said circuit board and additionally bent in at least one direction perpendicular to said first planes of bending to provide a U-shaped configuration, protruding at least in part from a said cut-out portion of said circuit board, for grasping a portion of a wire lead external to and otherwise connected with said circuit board, three of said intermediate wire lengths of said embedded wires being pinched at said U-shaped configurations thereof so as to clamp respective lead wires of said windings in respect to the electrical connections between embedded wires and said lead wires of said windings.

2. Alternator-rectifier unit according to claim 1, in which each of said intermediate wire lengths protruding at least in part from a said cut-out portion of said circuit board is bent at both ends in substantially the same first plane of bending, also bent in approximately parallel second planes perpendicular to said first plane of bending, and bent in the middle of said intermediate wire length in a third plane of bending at the least approximately parallel to said first plane of bending, said wire bends of each of said intermediate wire lengths in said second plane of bending, as seen in a direction perpendicular to said approximately parallel second planes of bending, providing a U-shaped profile with at least one leg of the U of said profile shape extending into said cut-out portion of said circuit board through which the wire of said intermediate wire length passes.

3. Alternator-rectifier unit according to claim 2, in which each of said intermediate wire lengths is bent in the middle in said third plane of bending, in a U-shaped profile of sufficient width for clamping of one of said lead wires in the bend of said third plane of bending and between the wire bends in U-shape in second parallel planes of bending.

4. Alternator-rectifier unit according to claim 3, in which the middle bend of said intermediate wire length is located at least in part within the cut-out portion of said circuit board through which said intermediate wire length passes.

5. Alternator-rectifier unit according to claim 2, in which the middle bend of each said intermediate wire length is a tight bend doubling said intermediate wire length on itself so that the bends of said intermediate wire length in said second planes of bending, are closely adjacent and said second planes of bending are substantially parallel, the lead wire clamped in said intermediate wire length being clamped by pinching effect of said bends in said second planes of bending, so that said lead wire fits within said U-shaped profile.

6. Alternator-rectifier unit according to claim 1, in which each of said intermediate wire lengths protruding at least in part from a said cut-out portion of said cut-out portion of said circuit board is bent at both ends respectively in parallel first planes of bending, so as to lead intermediate length outward beyond one of the surface planes of said circuit board, and additionally bent in each said of parallel first plane of bending in a manner doubling said intermediate length of wire on itself towards said circuit board, the midportion of each of said intermediate lengths of wire being bent in U-shape one said doubled-back portion thereof in one of said first planes of bending and the other of said double-back portions thereof in the other of said first planes of bending, so as to bring the doubled-back portions of said intermediate wire lengths substantially opposite each other, three of said wire lengths of said imbedded wires being pinched so as to clamp respective lead wires of said windings in respective electrical connections between said imbedded wires and said lead wires of said windings, with said lead wiring in each case set within the U-shape of the midportion bend of the said intermediate wire length.

7. Alternator-rectifier unit according to claim 1, in which each of said intermediate wire lengths protruding at least in part from a said cut-out portion of said circuit board is bent into a two-turn coil extending out beyond one of the surface planes of said circuit board and projecting out of the cut-out portion of said circuit board through which the said intermediate wire length passes, the respective two-turn coils of three of said intermediate wire lengths of said imbedded wires being pinched so at to clamp the respective lead wires of said windings between the turns of a said coil in respective electrical connections between said embedded wires and said and lead wires of said windings.

8. Alternator-rectifier unit according to claim 1, in which each of said intermediate wire lengths protruding at least in part from a said cut-out portion of said circuit board is bent at both ends in the same first plane of bending, said intermediate wire length being doubled back towards said circuit board in approximately parallel second planes of bending perpendicular to said first plane of bending in portions of said intermediate length respectively adjacent to said bends in said first plane of bending, each said intermediate wire length being further bent in U-shape in each of said approximately parallel second planes of bending so as to bring the midportion of said intermediate wire length again away from said surface plane of said circuit board and the midportion of said intermediate wire length being also bent in U-shape in a plane parallel to said first plane of bending so as to space said U-shaped bends in said approximately parallel second planes of bending, three of said intermediate wire lengths of said embedded wires being pinched with respect to said U-shaped bends in said second planes of bending so as to clamp respective lead wire of said windings in respective electrical connections between said embedded wire and said lead wires of said windings.

9. Alternator-rectifier unit according to claim 1, in which each of said intermediate wire lengths protruding at least in part from a said cut-out portion of said circuit board is bent at both ends and substantially the same plane of bending said intermediate length of wire being also doubled back towards said circuit board over respective portions of said wire adjacent to said bends at both ends of said intermediate portion and being further bent in its midportion in U-shape between said doubled-back portions, three of said intermediate wire lengths of said embedded wires having said doubled-back portions pinched together around respective feed wires of said windings held in said U-shaped bend of said embedded wire intermediate length midportion in respective electrical connections between said embedded wires and said lead wires of said windings.

* * * * *